US008835189B2

(12) United States Patent
Inoue

(10) Patent No.: US 8,835,189 B2
(45) Date of Patent: Sep. 16, 2014

(54) USE OF A MAGNETIC BODY IN A METHOD FOR MANUFACTURING AN ORGANIC EL ELEMENT TO IMPROVE THE PRECISION OF TRANSFER OF AN ORGANIC DONOR LAYER AND AN ORGANIC EL DEVICE MANUFACTURED BY THE SAME METHOD

(75) Inventor: Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 493 days.

(21) Appl. No.: 13/319,072

(22) PCT Filed: Mar. 24, 2010

(86) PCT No.: PCT/JP2010/002082
§ 371 (c)(1),
(2), (4) Date: Nov. 4, 2011

(87) PCT Pub. No.: WO2010/146754
PCT Pub. Date: Dec. 23, 2010

(65) Prior Publication Data
US 2012/0043536 A1   Feb. 23, 2012

(30) Foreign Application Priority Data
Jun. 18, 2009   (JP) ................. 2009-145352

(51) Int. Cl.
*H01L 21/00* (2006.01)
*B41M 5/382* (2006.01)
*H01L 51/56* (2006.01)
*B41M 5/26* (2006.01)
*H01L 27/32* (2006.01)
*H05B 33/10* (2006.01)
*H01L 51/00* (2006.01)

(52) U.S. Cl.
CPC ........... *H01L 51/56* (2013.01); *B41M 5/38221* (2013.01); *B41M 5/265* (2013.01); *H01L 27/3281* (2013.01); *H01L 27/3211* (2013.01); *H05B 33/10* (2013.01); *H01L 51/001* (2013.01); *H01L 51/0013* (2013.01)
USPC .................................................. 438/3; 257/40

(58) Field of Classification Search
CPC ... H01L 51/56; H01L 51/001; H01L 51/0013; H01L 27/3211; H01L 27/3281; H05B 33/10; B41M 5/265; B41M 5/38221
USPC ................................................. 438/3; 257/40
See application file for complete search history.

(56) References Cited

U.S. PATENT DOCUMENTS 5,688,551 A * 11/1997 Littman et al. ............... 427/64
7,534,545 B2 * 5/2009 Kang et al. ................... 430/201

(Continued)

FOREIGN PATENT DOCUMENTS

CN    1966279 A    5/2007
JP    7-101124 A   4/1995

(Continued)

OTHER PUBLICATIONS

International Search Report received for PCT Patent Application No. PCT/JP2010/002082, mailed on Jun. 22, 2010, 4 pages (2 pages of English Translation and 2 pages of International Search Report).

*Primary Examiner* — Stephen W Smoot
*Assistant Examiner* — Vicki B Booker
(74) *Attorney, Agent, or Firm* — Morrison & Foerster LLP

(57) ABSTRACT

A donor film 40 including an organic donor layer 42 and a transfer target substrate 12 including a lower electrode 7 are prepared. The organic donor layer 42 is thermally transferred to the top of the lower electrode 7 of the transfer target substrate 12 to form an organic layer 17 by placing the donor film 40 between the transfer target substrate 12 and a thermal head 38 and bringing the transfer target substrate 12 and the thermal head 38 into close contact with each other by magnetic attraction of a magnetic body 4, and then an upper electrode is formed on the organic layer 17, to obtain an organic EL element. This provides an organic EL element with excellent quality free from unevenness in the transfer of the organic donor layer from the donor film even when the transfer target substrate is large in size.

9 Claims, 15 Drawing Sheets

(56) References Cited

U.S. PATENT DOCUMENTS

| | | |
|---|---|---|
| 2003/0068525 A1 | 4/2003 | Bellmann et al. |
| 2003/0148022 A1 | 8/2003 | Kishimoto |
| 2004/0096698 A1 | 5/2004 | Kishimoto |
| 2006/0088698 A1 | 4/2006 | Majumdar et al. |
| 2007/0045540 A1 | 3/2007 | Kang et al. |
| 2007/0046072 A1 | 3/2007 | Kang et al. |
| 2007/0046762 A1 | 3/2007 | Kang et al. |
| 2007/0092721 A1 | 4/2007 | Kishimoto |
| 2007/0111117 A1 | 5/2007 | Noh et al. |

FOREIGN PATENT DOCUMENTS

| | | |
|---|---|---|
| JP | 7-192953 A | 7/1995 |
| JP | 2001-155859 A | 6/2001 |
| JP | 2002-158089 A | 5/2002 |
| JP | 2003-187972 A | 7/2003 |
| JP | 2005-500652 A | 1/2005 |
| JP | 2005-310399 A | 11/2005 |
| JP | 2007-141816 A | 6/2007 |
| JP | 2008-518397 A | 5/2008 |

\* cited by examiner (a)

(b)

(c)

(d)

(e)

(f)

(a)

(b)

(c)

(d)

(a)

(b)

(c)

(d)

(e)

(f)

(a)

(b)

(c)

(d)

(e)

(f)

USE OF A MAGNETIC BODY IN A METHOD FOR MANUFACTURING AN ORGANIC EL ELEMENT TO IMPROVE THE PRECISION OF TRANSFER OF AN ORGANIC DONOR LAYER AND AN ORGANIC EL DEVICE MANUFACTURED BY THE SAME METHOD

CROSS REFERENCE TO RELATED APPLICATIONS

This is a U.S. National Phase patent application of PCT/JP2010/002082, filed Mar. 24, 2010, which claims priority to Japanese Patent Application No. 2009-145352, filed Jun. 18, 2009, each of which is hereby incorporated by reference in the present disclosure in its entirety.

TECHNICAL FIELD

The present disclosure relates to an organic electroluminescence (EL) element and a method for manufacturing the same, and more particularly to measures for improving the precision of transfer of an organic donor layer made of an organic material.

BACKGROUND ART

As an example method for manufacturing an organic EL element, proposed is a method of thermally transferring an organic donor layer from a donor film to a transfer target substrate selectively using a thermal stamp (see Patent Document 1, for example).

CITATION LIST

Patent Document

PATENT DOCUMENT 1: Japanese Patent Publication No. 2005-500652 (par. 0081)

SUMMARY OF THE INVENTION

Technical Problem

The method for manufacturing an organic EL element using thermal stamping as described in Patent Document 1 has the following problem. In transfer of an organic donor layer to a large-size transfer target substrate, distortion occurs in the substrate, making it difficult to keep a fixed spacing between a thermal head and the transfer target substrate. As a result, the organic donor layer may not be transferred entirely or partly from a donor film to the substrate, increasing the frequency of occurrence of transfer unevenness, i.e., pattern blurring, and thus causing display unevenness in the resultant organic EL element.

If the thermal head is pressed against the transfer target substrate too strongly mechanically in an attempt to avoid transfer unevenness of the organic donor layer, the transfer target substrate may possibly be damaged.

In view of the problem described above, it is an objective of the present disclosure to provide an organic EL element with excellent quality by avoiding unevenness in the transfer of the organic donor layer from the donor film even when the transfer target substrate is large in size.

Solution to the Problem

To attain the objective described above, the present disclosure is characterized in bringing the thermal head into close contact with the transfer target substrate by magnetic attraction.

Specifically, in the first to eighth disclosures, directed to a method for manufacturing an organic EL element, the following measures are taken.

The first disclosure is characterized to obtain an organic EL element in the following manner: preparing a donor film including an organic donor layer and a transfer target substrate including a first electrode, and thermally transferring the organic donor layer to the top of the first electrode of the transfer target substrate to form an organic layer by placing the donor film between the transfer target substrate and a thermal head and bringing the transfer target substrate and the thermal head into close contact with each other by magnetic attraction of a magnetic body, and then forming a second electrode on the organic layer.

The second disclosure is characterized in that, in the first disclosure, the thermal head is switched between a state having magnetic attraction and a state having no magnetic attraction, and is attracted into contact with the magnetic body in the state having magnetic attraction.

The third disclosure is characterized in that, in the first or second disclosure, the magnetic body is formed on a surface of the transfer target substrate on the side of formation of the organic layer.

The fourth disclosure is characterized in that, in the first or second disclosure, the magnetic body is formed on a surface of the transfer target substrate opposite to the side of formation of the organic layer.

The fifth disclosure is characterized in that, in the first or second disclosure, the magnetic body is patterned.

The sixth disclosure is characterized in that, in the fifth disclosure, the magnetic body is patterned to be present between the transfer target substrate and the first electrode.

The seventh disclosure is characterized in that, in the fifth disclosure, the magnetic body also serves as an interconnect pattern of the organic EL element.

The eighth disclosure is characterized in that, in any one of the first to seventh disclosures, the magnetic body includes at least one selected from iron, chromium, nickel, cobalt, and manganese.

The ninth disclosure relates to an organic EL element manufactured by the method for manufacturing an organic EL element described in any one of the first to eighth disclosures.

Advantages of the Invention

According to the first to ninth disclosures, the donor film comes into close contact with the transfer target substrate tightly by the magnetic attraction of the magnetic body. Therefore, even when the transfer target substrate is large in size, the organic donor layer can be transferred to the transfer target substrate with high precision, and an organic EL element with excellent quality free from display unevenness can be manufactured. Also, since it is unnecessary to press the thermal head against the transfer target substrate excessively in an attempt to eliminate transfer unevenness, the transfer target substrate can be prevented from damage.

In particular, in the fourth disclosure, since the magnetic body is formed on the surface of the transfer target substrate opposite to the side of formation of the organic layer, the magnetic body is not affected by the film formation process executed on the side of formation of the organic layer. This makes it easy to adopt the conventional film formation process, and thus is advantageous from the cost standpoint.

DESCRIPTION OF EMBODIMENTS

Embodiments of the present disclosure will be described hereinafter with reference the accompanying drawings.

First Embodiment

Figure 1:
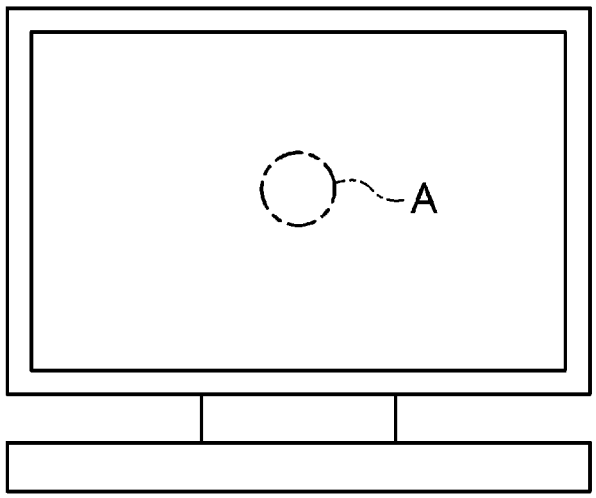
FIG. 1 is an external view of an organic EL display in the first embodiment.
Figure 2:
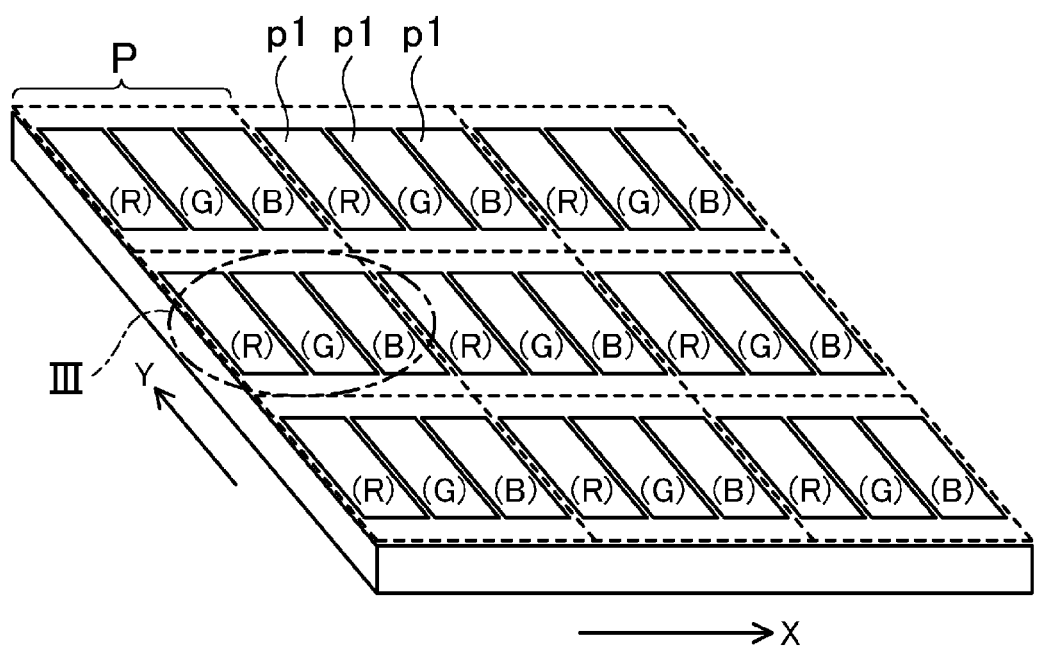
FIG. 2 is a perspective view illustrating a pixel array having a number of pixels arranged in stripes, which is an enlarged view of portion A in FIG. 1.

FIG. 1 shows an organic EL display 1 in the first embodiment. In observing portion A of the organic EL display 1, a number of pixels P, each including red (R), green (G), and blue (B), are arranged in the lateral (X) and vertical (Y) directions of the screen as shown in FIG. 2. In other words, one pixel P is defined as a set of each one R, G, and B sub-pixels p1. In a full high-definition organic EL display, 1920 pixels P in the X direction and 1080 pixels P in the Y direction are arranged in a matrix. Although FIG. 2 shows arrangement of R, G, and B sub-pixels in stripes, R, G, and B sub-pixels may be in delta arrangement, and this will not affect the purport of the present disclosure. Also, although R, G, and B sub-pixels are juxtaposed in FIG. 2, they may be stacked one upon another, or arranged in other ways, which will not affect the purport of the present disclosure, either.

Figure 3:
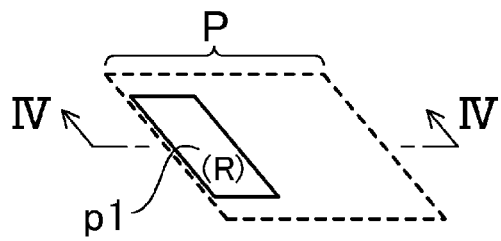
FIG. 3 shows one red (R) sub-pixel of one pixel in portion III in FIG. 2.
Figure 4:
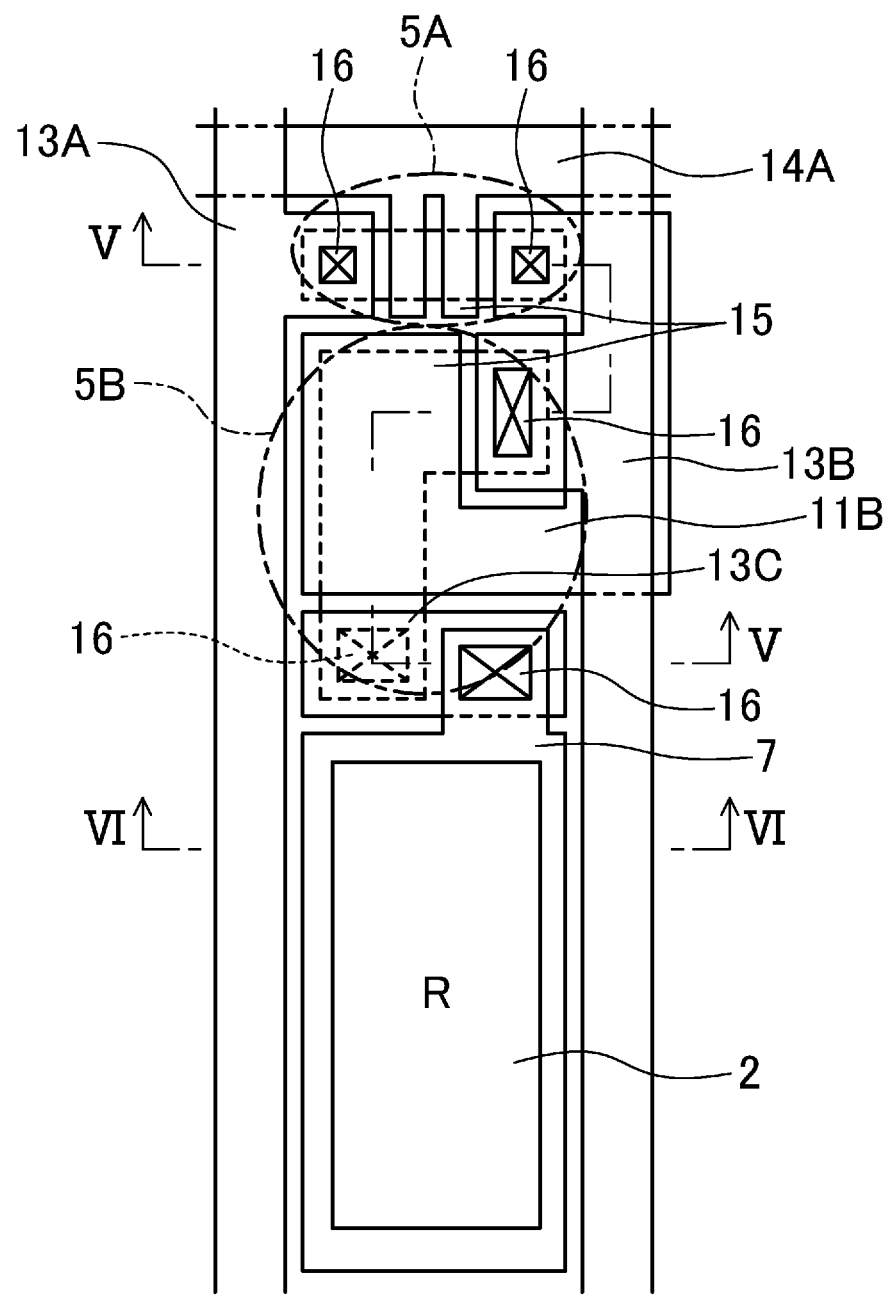
FIG. 4 is a plan view of one sub-pixel corresponding to line IV-IV in FIG. 3.

FIG. 3 shows a red (R) sub-pixel p1 of one pixel P in portion III in FIG. 2. FIG. 4 is a plan view of the sub-pixel p1 corresponding to line IV-IV in FIG. 3, representing a planar configuration of the red (R) sub-pixel p1 in the first embodiment. Sub-pixels having such a configuration are formed for each color. In each pixel P, a rectangular region in the lower half of FIG. 4 conceptually serves as a red (R) light emitting region 2, and an edge cover 8 to be described later (see FIG. 6) covers the entire surface of each sub-pixel p1 except for the light emitting region 2 as viewed from top.

Figure 5:
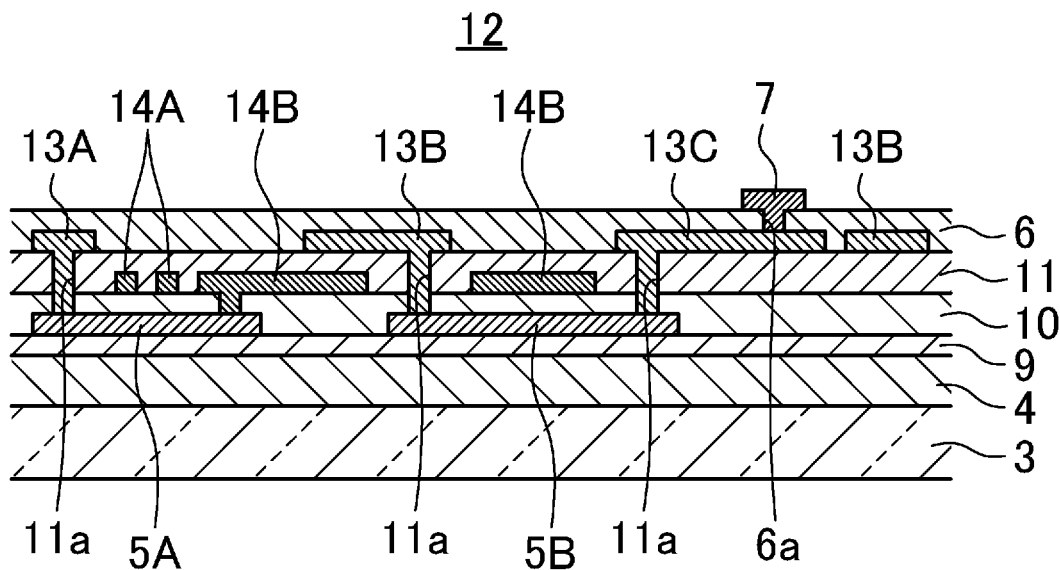
FIG. 5 is a cross-sectional view taken along line V-V in FIG. 4.
Figure 6:
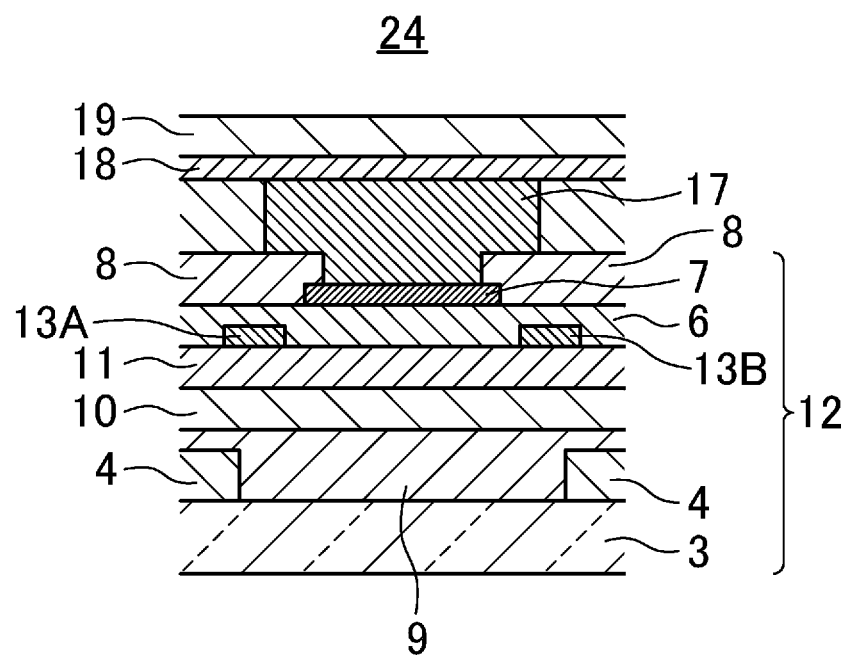
FIG. 6 is a cross-sectional view taken along line VI-VI in FIG. 4.
Figure 7:
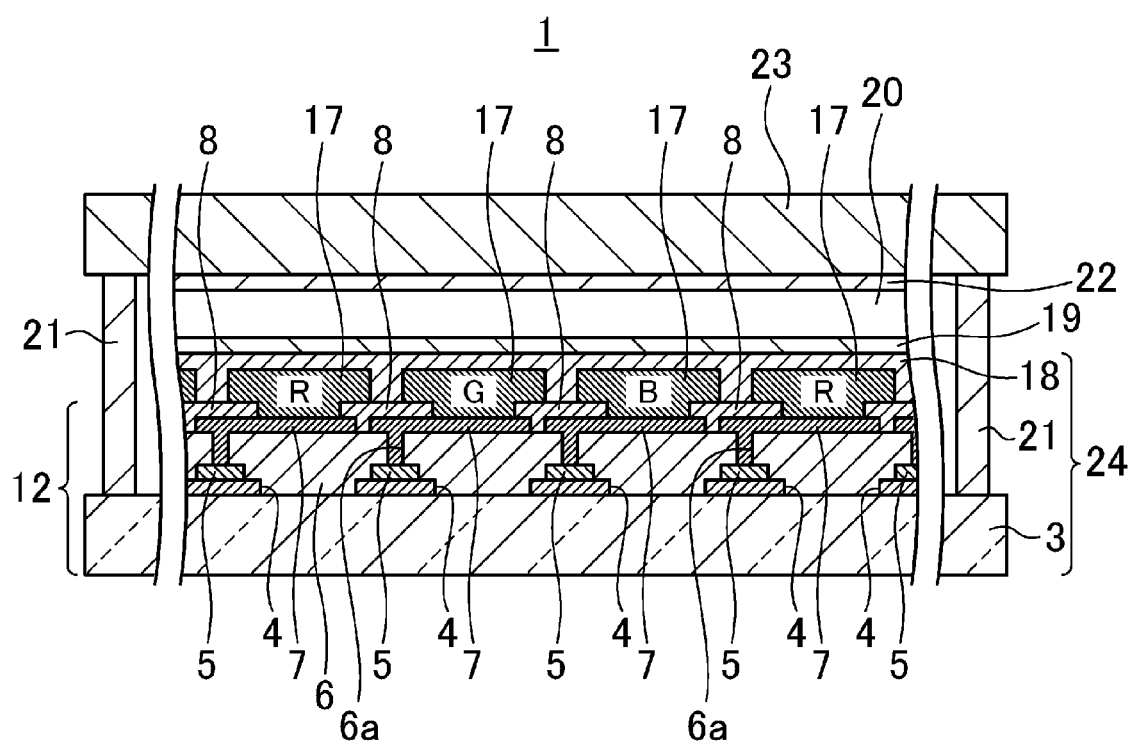
FIG. 7 is a cross-sectional view of the active organic EL display in the first embodiment.
Figure 8:
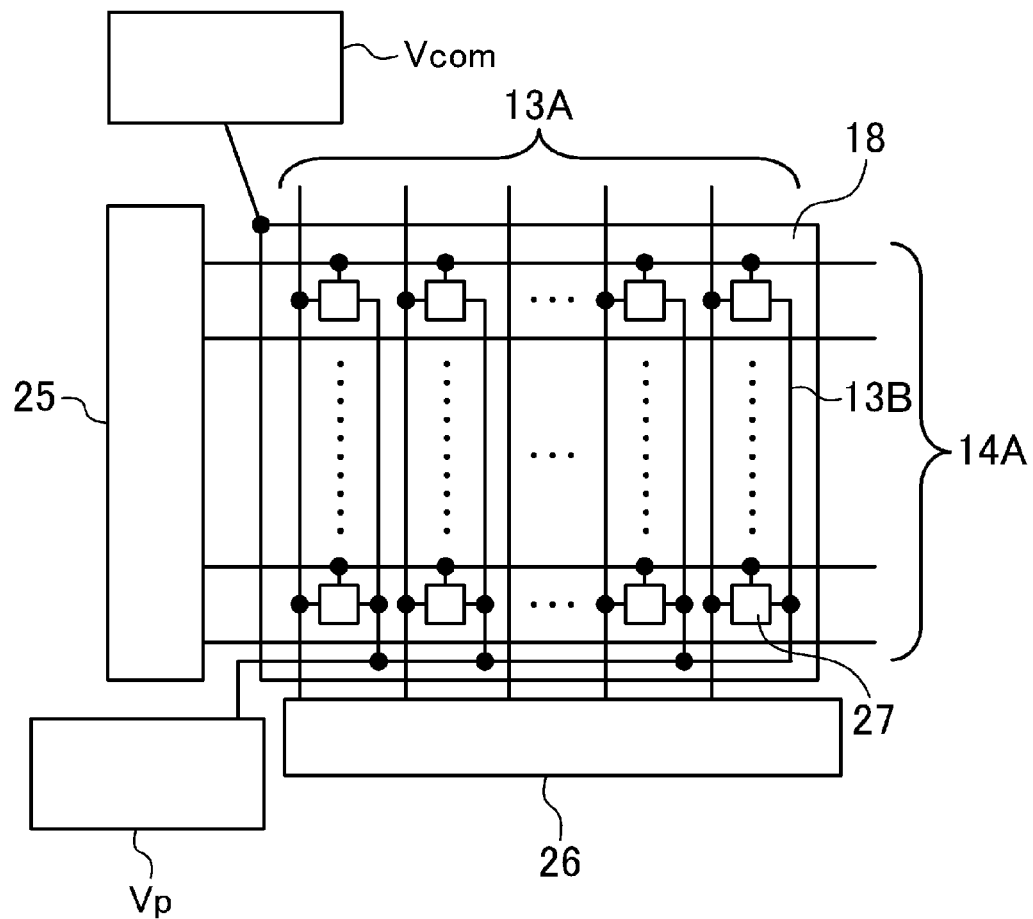
FIG. 8 is a conceptual illustration of drive circuits of the organic EL display in the first embodiment.
Figure 9:
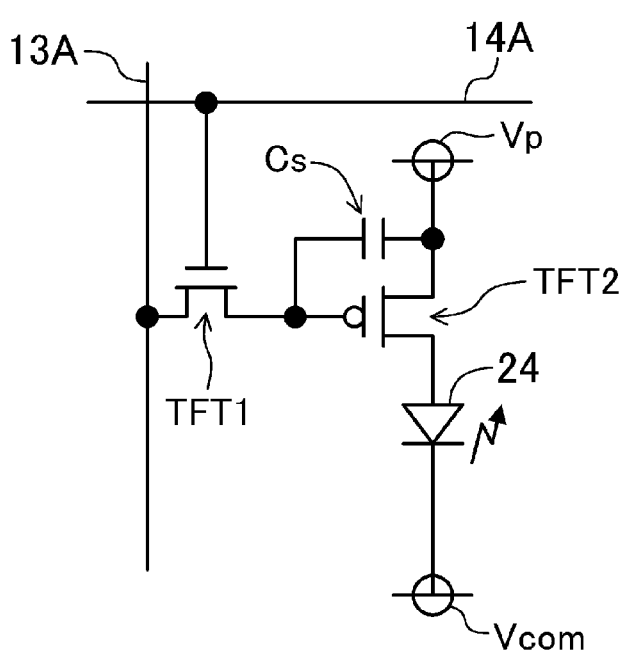
FIG. 9 is a pixel circuit diagram in the first embodiment.

FIG. 5 is a cross-sectional view taken along line V-V in FIG. 4. FIG. 6 is a cross-sectional view taken along line VI-VI in FIG. 4. FIG. 7 is a cross-sectional view of the organic EL display 1. FIG. 8 is a conceptual illustration of drive circuits of the organic EL display 1. FIG. 9 is a pixel circuit diagram.

In FIGS. 5-7, the reference character 3 denotes a transparent glass substrate 3. A magnetic body 4 is formed by patterning on the surface of the glass substrate 3 on the side on which an organic layer 17 (described later) is to be formed, and semiconductor regions (thin film transistors and interconnects) 5 made of polysilicon are formed by patterning on the magnetic body 4, where the magnetic body 4 also serves as an interconnect pattern of the organic EL element. Note that, in FIGS. 4 and 5, the semiconductor regions are denoted by 5A and 5B. The magnetic body 4 and the semiconductor regions 5 are covered with a flattening insulating layer 6 having through holes 6a. Lower electrodes 7 as the first electrodes are formed by patterning on the flattening insulating layer 6, and connected to the interconnect pattern in the semiconductor regions 5 via the through holes 6a. The edges of the lower electrodes 7 are covered with an edge cover 8 (see FIG. 6). The opening of the pattern of the magnetic body 4 is larger than the opening of the edge cover 8 as viewed from the top of the lower electrode 7 of each sub-pixel p1. In FIGS. 5 and 6, the reference character 9 denotes a protection film, 10 a gate insulating film, 11 an interlayer film having contact holes 11a. Thus, a transfer target substrate 12 is configured.

In FIGS. 4-6, the reference character 13A denotes a source interconnect (data line), 13B a source interconnect (power supply line), 13C a source line, 14A a gate interconnect (scanning line), 14B a gate interconnect, 15 a channel region, and 16 an upper/lower pattern connection. Note that, in FIG. 4, the magnetic body 4 and any components formed above the lower electrode 4 and the edge cover 8 are omitted. Note also that, in FIG. 5, any components formed above the lower electrode 4 and the edge cover 8 are omitted.

On the transfer target substrate 12, the organic layer 17 is formed by thermal stamping for each of the red (R), green (G), and blue (B) colors that are the light emitting components of the organic EL display 1. In the organic layer 17, only a light emitting layer may be made to have different colors, R, G, and B, at different portions by thermal stamping, and the other layers may be formed over the entire display region including the R, G, and B portions at one time with no color differentiation by thermal stamping or a known vacuum evaporation method.

An upper electrode 18 as the second electrode is formed on the entire surface of the organic layer 17 including the display region of the organic layer 17 by vacuum evaporation. The upper electrode 18 is connected to a terminal pullout pattern at positions outside the display region. Thus, an organic EL element 24 is configured.

A sealing film 19 is formed on the upper electrode 18 by a known plasma CVD method. The transfer target substrate 12 is then bonded with a sealing plate 23 with a drying member 22 attached thereto, using a sealing member 21 such as an epoxy resin, in an atmosphere of a nitrogen gas containing very small amounts of water and oxygen as a sealing gas 20. By this bonding, the space between the sealing plate 23 and the sealing film 19 on the transfer target substrate 12 is filled with the sealing gas 20, thereby completing the organic EL display 1.

Drive circuits of the organic EL display 1 provided with the organic EL element 24 having the above configuration will be described.

As shown in FIG. 8, as the drive circuits of the organic EL display 1, a scanning line drive circuit 25 and a data line drive circuit 26 are driven appropriately based on input signals for display of images. Pixel circuits 27 are formed at the intersections of the scanning lines 14A and the data lines 13A. The pixel circuits 27 are connected to the corresponding power supply lines 13B from a power supply circuit Vp. The pixel circuits 27 are also connected to a power supply pattern for a power supply circuit Vcom formed of a solid film via the organic EL element 24.

In each pixel circuit 27, as shown in FIG. 9, the organic EL element 24 is driven with a constant current by the operations of a thin film transistor TFT1, a thin film transistor TFT2, and a storage capacitance Cs based on the power supply circuit Vp, the power supply circuit Vcom, and signals from the scanning line 14A and the data line 13A, whereby the organic EL element 24 emits light.

The drive circuit of FIG. 9 is implemented by the configuration of FIG. 4. In FIG. 5, each of the plurality of source interconnects (data lines) 13A formed in stripes is electrically connected to the thin film transistor TFT 1 for input of a data signal to the thin film transistor TFT 1. The plurality of gate interconnects (scanning lines) 14A extend in parallel with each other in the direction orthogonal to the source interconnects 13A. Each of the plurality of gate interconnects 14A, which serves as the gate of the thin film transistor TFT1, provides a scanning signal to the thin film transistor TFT1. The drain of the thin film transistor TFT1 is connected to the gate interconnect 14B, which serves as the gate of the thin film transistor TFT2. An overlap portion between the source interconnect 13B and the gate interconnect 14B forms the storage capacitance Cs. The source interconnect 13B is connected to the source of the thin film transistor TFT2. The drain of the thin film transistor TFT2 is electrically connected to the lower electrode 7.

The thin film transistor TFT1 supplies a charge to the storage capacitance Cs based on the signals received from the source interconnect 13A and the gate interconnect 14A, and operates the thin film transistor TFT2, to supply a current to the lower electrode 7 based on the input signals.

Although the magnetic body 4 is formed on the glass substrate 3 and the thin film transistors TFT1 and TFT2 are formed on the magnetic body 4 in FIG. 5, the thin film transistors TFT1 and TFT2 can be formed by a known method. Although the top gate structure is adopted as shown in FIG. 5 in the first embodiment, a bottom gate structure may also be adopted, without affecting the purport of the present disclosure. Also, although the semiconductor regions 5A and 5B of the thin film transistors TFT1 and TFT2 are made of polysilicon in the first embodiment, they may be made of amorphous silicon, microcrystalline silicon, or an oxide semiconductor such as zinc oxide, without affecting the purport of the present disclosure.

Next, a procedure of forming the magnetic body 4 in the film formation process in the first embodiment will be described with reference to FIGS. 10A-10F that are step-by-step views corresponding to FIG. 6.

Figure 10:
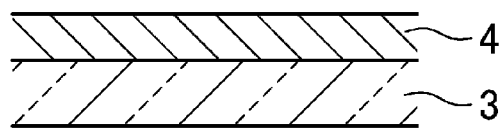
FIGS. 10A-10F are views showing step by step a procedure of forming a magnetic body in the film formation process in the first embodiment, which are cross-sectional views corresponding to FIG. 6.
Figure 10:
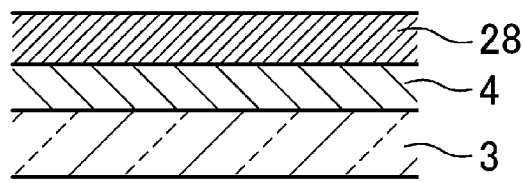
Figure 10:
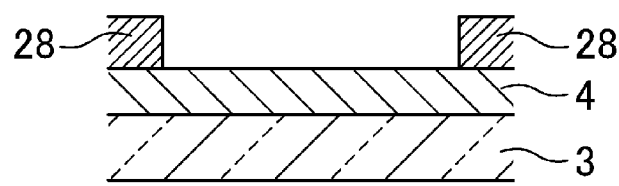
Figure 10:
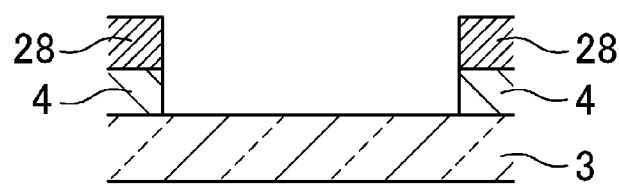
Figure 10:
Figure 10:
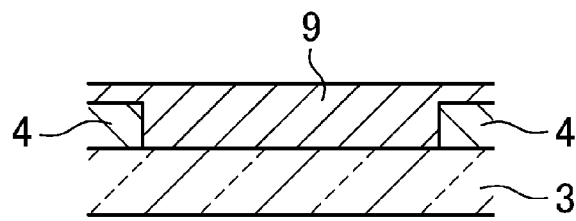

First, as shown in FIG. 10A, the alkali-free glass substrate 3 is prepared. Foreign matters such as organic substances are removed from the glass substrate 3 in advance by IPA ultrasonic cleaning, pure-water cleaning, etc. On the glass substrate 3, nickel (Ni) is deposited to a thickness of 100 nm as the magnetic body 4 by DC sputtering using a Ni target (purity: 5 N) under the film formation conditions of an ultimate vacuum of $1.0 \times 10^{-3}$ Pa, an Ar gas pressure of 0.6 Pa, and an input power of 80 mW/cm$^2$.

Then, as shown in FIG. 10B, a general photoresist 28 is formed by spin coating.

Subsequently, as shown in FIG. 10C, after exposure of a predetermined pattern of the photoresist 28 to light using a photomask by stepper exposure equipment, exposed portions of the photoresist 28 are removed with an alkali developer, and then the resultant glass substrate 3 is washed with water.

Thereafter, as shown in FIG. 10D, the magnetic body 4 is etched with a diluted nitric acid containing phosphoric acid, nitric acid, and water at room temperature for three minutes, and then washed with water.

Then, as shown in FIG. 10E, the photoresist 28 is removed with a remover solution.

Thereafter, as shown in FIG. 10F, for preventing diffusion of impurities from the glass substrate 3 and easing the steps of the pattern of the magnetic body 4, silicon oxynitride (SiON) is deposited on the entire surface of the glass substrate 3 to a thickness of 300 nm as a protection film 9 by a known chemical vapor deposition (CVD) method.

Although Ni is used as the magnetic body 4 in the film formation process described above, iron (Fe) and cobalt (Co) can also be used. An alloy at least containing chromium (Cr) and an alloy at least containing manganese (Mn) can also be used. It is also possible to use an alloy at least containing nickel (Ni), an alloy at least containing iron (Fe), and an alloy at least containing cobalt (Co).

Next, a procedure of manufacturing the transfer target substrate 12 (TFT substrate) in the film formation processes in the first embodiment will be described with reference to FIGS. 11A-11D and 12A-12C that are step-by-step views corresponding to FIG. 5. FIGS. 11A-11D show the first half of the procedure of manufacturing the transfer target substrate 12, and FIGS. 12A-12C show the second half of the procedure.

Figure 11:
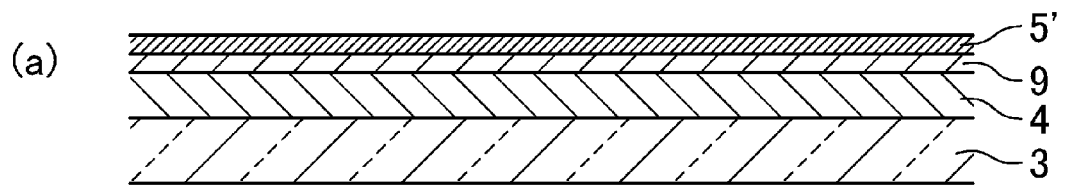
FIGS. 11A-11D are views showing step by step the first half of a procedure of manufacturing a transfer target substrate in the film formation process in the first embodiment, which are cross-sectional views corresponding to FIG. 5.
Figure 11:
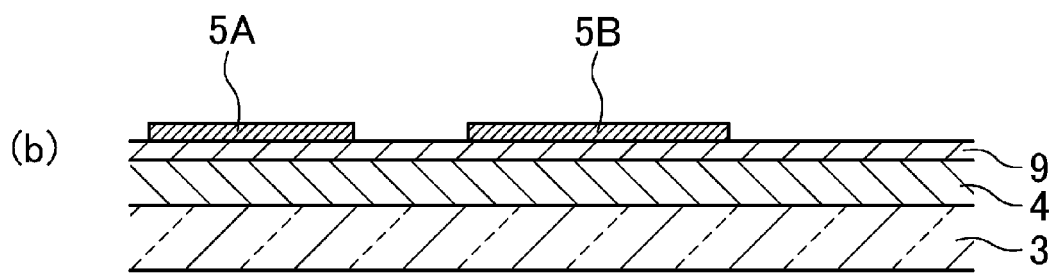
Figure 11:
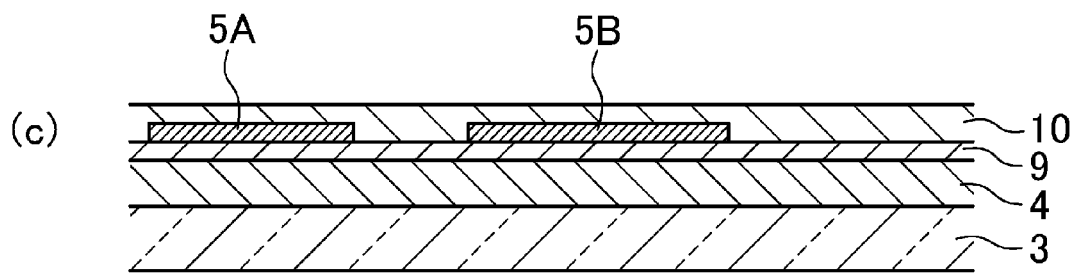
Figure 11:
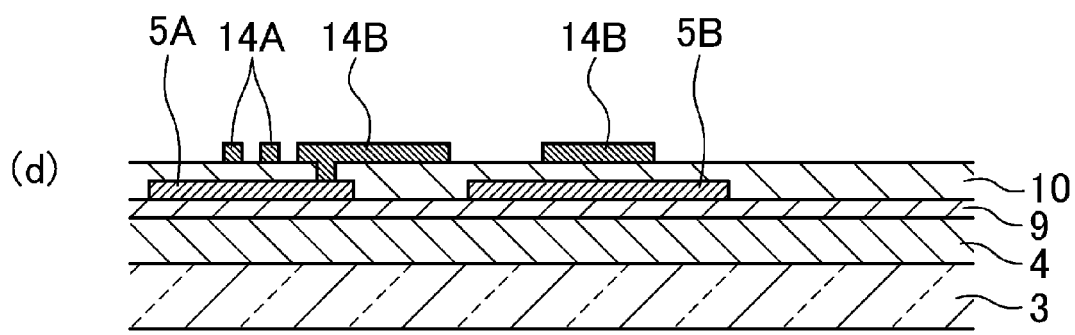
Figure 12:
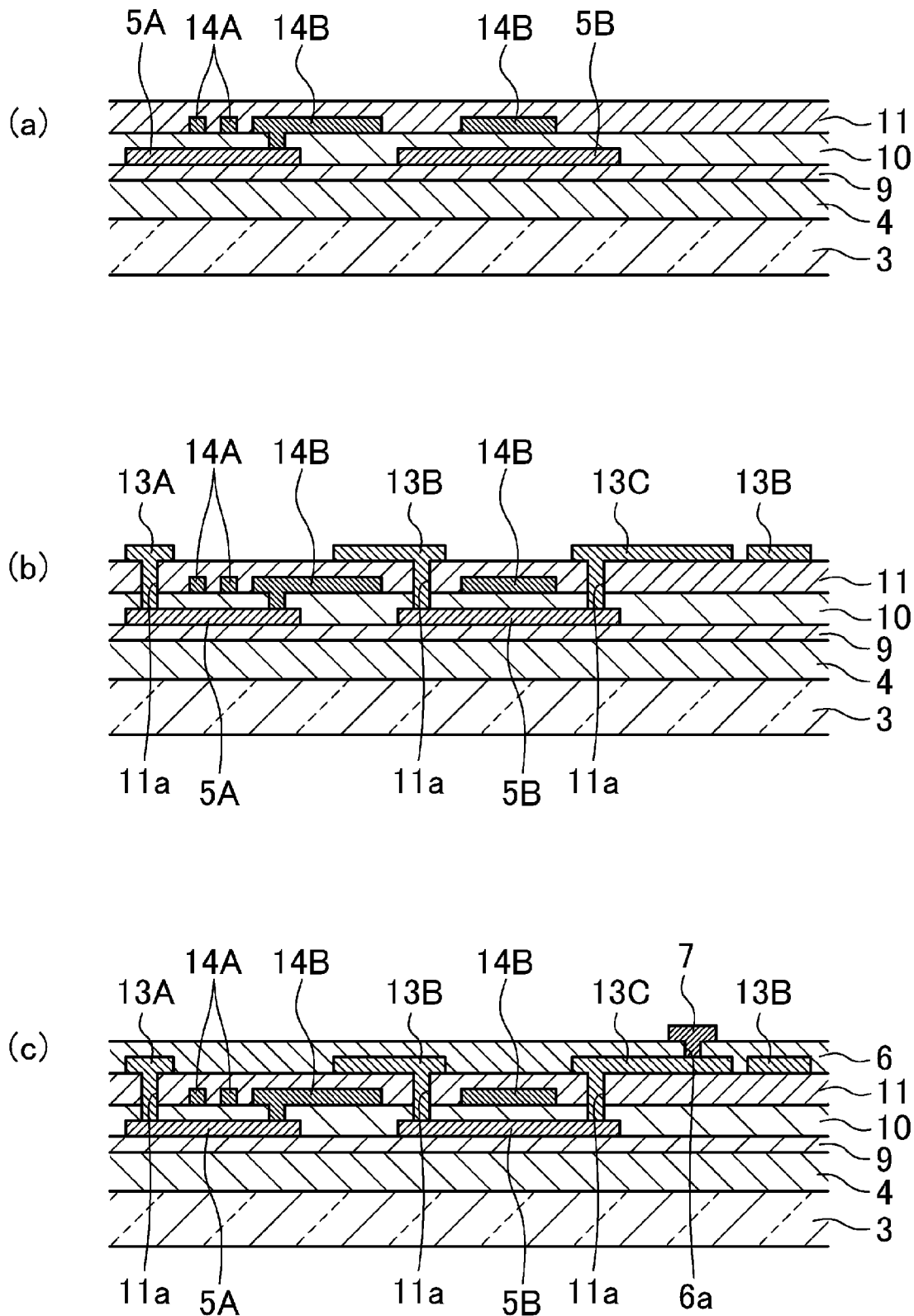
FIGS. 12A-12C are views showing step by step the second half of the procedure of manufacturing a transfer target substrate in the film formation process in the first embodiment, which are cross-sectional views corresponding to FIG. 5.

First, in the first half of the procedure, as shown in FIG. 11A, a semiconductor film 5' is formed on the protection film 9 formed in FIG. 10F. More specifically, an amorphous silicon film is formed to a thickness of 50 nm by plasma CVD and then subjected to solid-phase growth. In the solid-phase growth, a metal catalyst for promoting crystallization is added to the amorphous silicon film on the glass substrate 3 by a coating method or a film formation method, and then heated at a temperature that is high but is not so high as to cause deformation of the glass substrate 3, to form crystalline silicon from the metal additive as the start point. Thereafter, in a laser heat treatment process, the glass substrate 3 is irradiated with excimer laser light, to obtain polysilicon by polycrystallizing the amorphous silicon film.

Subsequently, after formation of a predetermined pattern on the polysilicon by a known photolithographic process using a photoresist, the resultant semiconductor film is etched by dry etching, and then the photoresist is removed, to form the semiconductor regions 5A and 5B by patterning as shown in FIG. 11B.

Thereafter, as shown in FIG. 11C, silicon oxide ($SiO_2$) is deposited on the protection film 9 covering the semiconductor regions 5A and 5B to a thickness of 50 nm to 200 nm as the gate insulating film 10 by a known CVD method, and then ion doping is performed to adjust the thresholds of the transistors.

Subsequently, as shown in FIG. 11D, a high-melting metal film is deposited on the entire surface of the gate insulating film 10 as the gate film, and then a photoresist is formed thereon to have a predetermined pattern by a known photolithographic process. Thereafter, the metal film is dry-etched by a known method, and the photoresist is removed, to form the gate interconnects 14A and 14B. Ion doping is then performed to adjust the resistance value, etc. of the silicon film, to form the thin film transistors TFT1 and TFT2.

Next, as the second half of the procedure of manufacturing the transfer target substrate 12, as shown in FIG. 12A, a silicon-based insulating film is formed on the entire surface of the gate insulating film 10 covering the gate interconnects 14A and 14B to a thickness of 400 nm to 900 nm as the interlayer insulating film 11 by a known CVD method.

Thereafter, as shown in FIG. 12B, contact holes 11a are formed through the interlayer insulating film 11, and the source interconnects 13A, 13B, and 13C are formed on the interlayer insulating film 11. The contact holes 11a are formed by patterning a photoresist by a known photolithographic process, etching contact hole portions by dry etching, and then removing the photoresist. The source interconnects 13A, 13B, and 13C are formed by forming a multilayer film including a low-resistance aluminum-based metal on the entire surface by sputtering, etching the multilayer film into a source interconnect pattern by a known photo-etching process, and then performing high-temperature heat treatment.

Subsequently, as shown in FIG. 12C, the flattening insulating layer 6 is formed on the interlayer insulating film 11 covering the source interconnects 13A, 13B, and 13C, and then the through holes 6a are formed through the flattening insulating layer 6. The lower electrodes 7 (pixel electrodes) are then formed including the regions of the through holes 6a. More specifically, a photosensitive acrylic resin, polyimide resin, phenol resin, or novolac resin is applied to the entire surface of the flattening insulating film 6 by spin coating. A predetermined pattern of the resultant resin is exposed to light, and the resultant substrate is developed with a developer such as an alkali solution, and then baked in a high-temperature oven at 200° C. or higher, thereby forming the through holes 6a having a depth of 1 μm to 4 μm. Thereafter, ITO is deposited on the entire surface of the resultant glass substrate 3 to a thickness of 80 nm to 200 nm by sputtering using a DC sputtering apparatus with an oxide target made of indium oxide ($In_2O_3$) containing 5 wt % to 20 wt % of tin oxide ($SnO_2$) as an ITO target. The resultant glass substrate 3 is then subjected to heat treatment at a temperature of 200° C. or higher for one to two hours. Thereafter, a photoresist is formed by patterning on the glass substrate 3 by a known photolithography process, etching is performed by a known wet etching method, and then the photoresist is removed, to form the lower electrodes 7 in a predetermined pattern.

Thereafter, the edge cover 8 is formed to cover edge portions of the lower electrodes 7 as shown in FIG. 6, to provide the state shown in FIG. 4, thereby completing the process of manufacturing the transfer target substrate 12 before formation of the organic layer 17. More specifically, a photosensitive polyimide resin is applied to the substrate in the state shown in FIG. 12C by spin coating, exposed to light using a predetermined photomask, developed with an alkali developer, and then subjected to heat treatment, thereby forming a pattern of the edge cover 8 having openings corresponding to the portions that are to be pixels, and thus completing the process of manufacturing the transfer target substrate 12.

It should be noted that, although the top gate TFTs are shown in the first embodiment, the effect of the present disclosure can also be obtained by forming bottom gate TFTs.

Next, a process of manufacturing the organic EL element 24 will be described. Although the organic layer 17 was described as a single layer as shown in FIG. 6 so far for simplicity of description, the organic layer 17 is actually of a multilayer structure having two or more layers because of function separation of the operation mechanism of the organic EL element 24.

Figure 14:
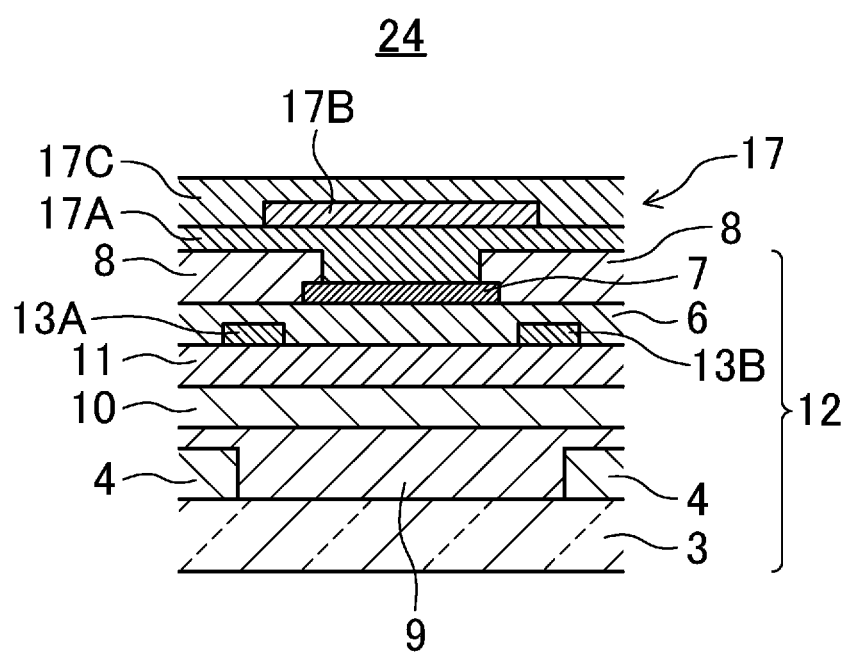
FIG. 14 is a cross-sectional view of the transfer target substrate at a stage immediately after the formation of the organic layer in the first embodiment.

In the first embodiment, the organic layer 17 has a three-layer structure (see FIG. 14). That is, on the lower electrode 7, formed sequentially are N,N-di(naphthalene-1-yl)-N,N-diphenyl-benzidene (NPB) having a thickness of 30 nm as a hole injection/transport layer 17A, a light emitting layer 17B having a thickness of 30 nm, and an aluminum-quinolinol complex (aluminato-tris-8-hydroxyquinolate (Alq3)) having a thickness of 40 nm as an electron transport/injection layer 17C. While different materials are used for the light emitting layer 17B depending on the R, G, and B light emitting colors, common materials are used for the other layers irrespective of the R, G, and B colors. As the materials of the light emitting layer 17B, used are ones that can provide necessary light emitting colors and have an affinity for each other, selected from metal oxinoid compounds [8-hydroxyquinolin metallic complexes], naphthalene derivatives, anthracene derivatives, diphenylethylene derivatives, vinylacetone derivatives, triphenylamine derivatives, butadiene derivatives, coumalin derivatives, benzoxazole derivatives, oxadiazole derivatives, oxazole derivatives, benzimidazole derivatives, thiadiazole derivatives, benzthiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, acridine derivatives, phenoxazone, quinacridone derivatives, rubrene, poly-p-phenylenevinylene, polysilane, etc.

Figure 13:
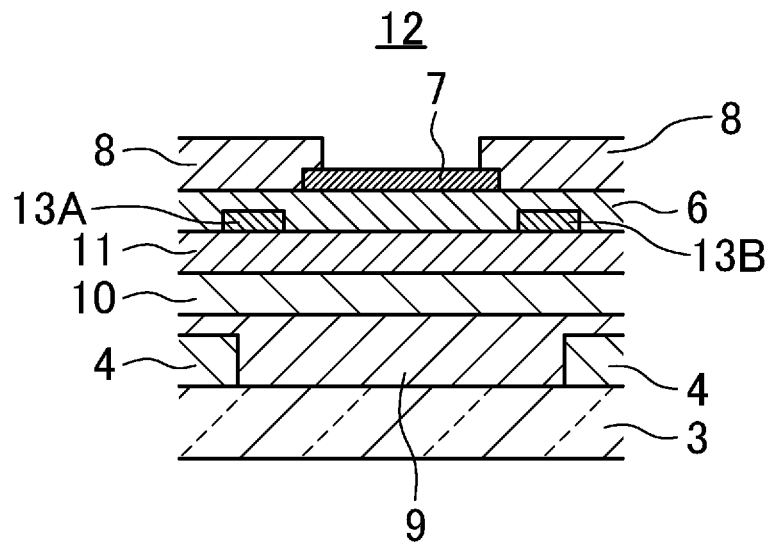
FIG. 13 is a cross-sectional view of the transfer target substrate at a stage immediately before formation of an organic layer in the first embodiment.

The transfer target substrate 12 is in the state shown in FIG. 13 at the start of the manufacturing process. FIG. 13 shows the state before formation of the organic layer 17 in FIG. 6. First, as shown in FIG. 14, NPB (N,N-di(naphthalene-1-yl)-N,N-diphenyl-benzidene) is deposited in a region including the display region of the organic EL display 1 to a thickness of 30 nm as the hole injection/transport layer 17A by a known vacuum evaporation method.

Figure 15:
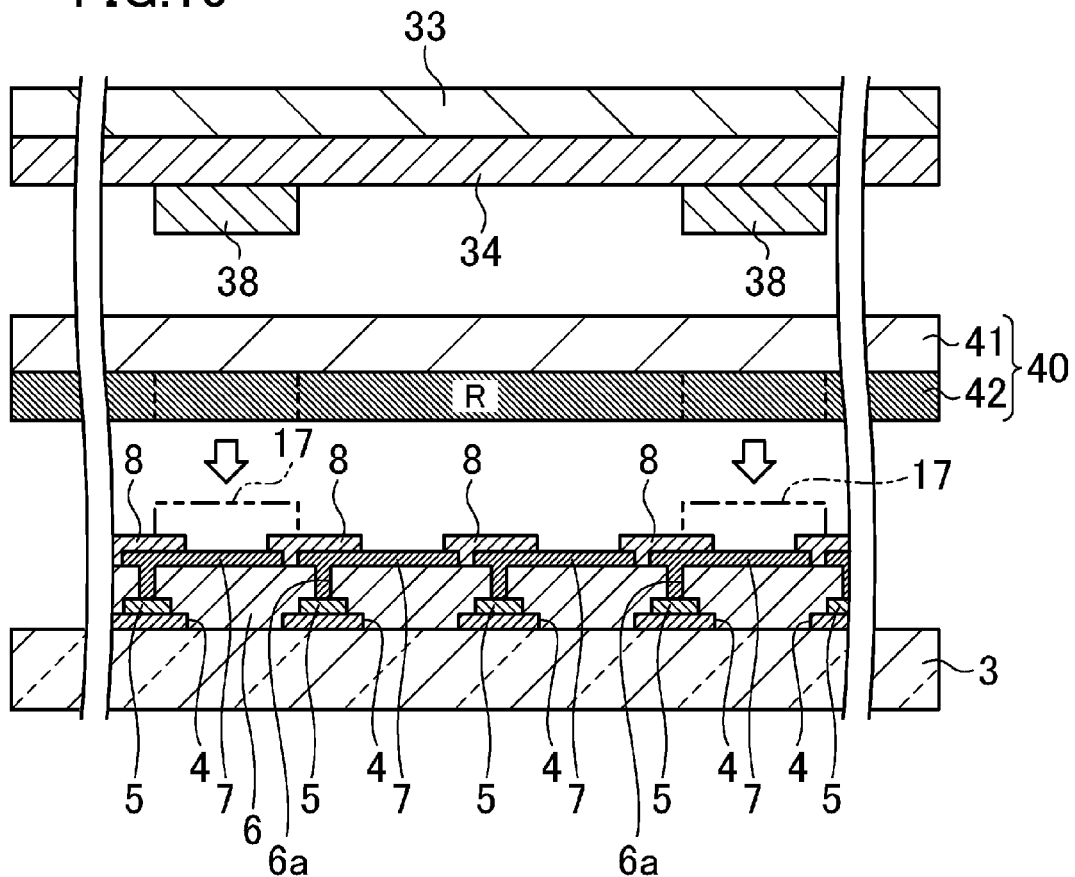
FIG. 15 is a view illustrating thermal stamping in the first embodiment.

Thereafter, by a thermal stamping method as shown in FIG. 15, red (R) portions of the light emitting layer 17B are first formed, sequentially followed by green (G) and blue (B) portions of the light emitting layer 17B separately, in a vacuum having an ultimate vacuum of $1.0 \times 10^{-3}$ Pa or less.

Figure 16:
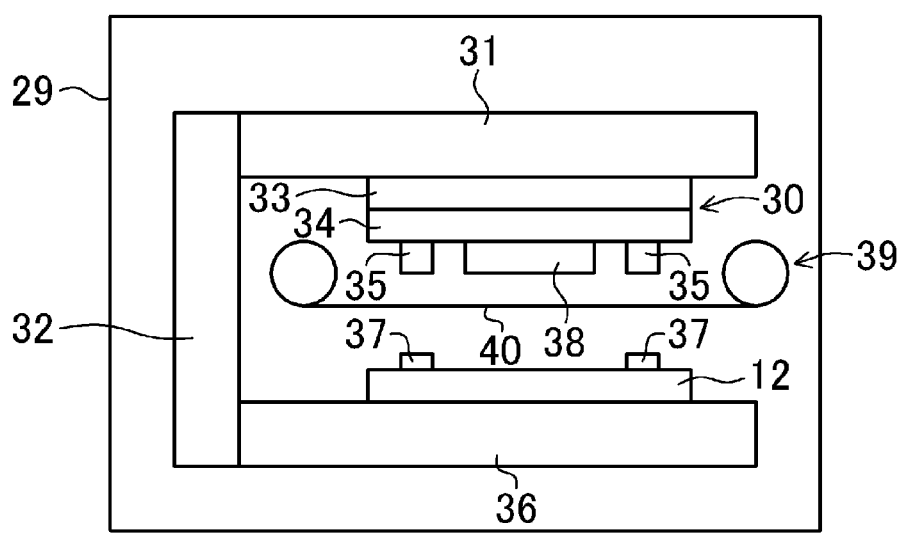
FIG. 16 is a conceptual illustration of an apparatus for thermal stamping.

FIG. 15 is a view illustrating how to perform thermal stamping. FIG. 16 is a conceptual view of an apparatus for thermal stamping.

In FIG. 16, a load-lock vacuum apparatus 29 has a thermal stamp 30 installed therein. The vacuum in the vacuum apparatus 29 is set so that the ultimate vacuum is $1.0 \times 10^{-3}$ Pa or less. The thermal stamp 30 is secured to an upper platform 31 and movable upward and downward with an up/down movable mechanism 32. The thermal stamp 30 has an electric magnet 33 secured to the bottom surface of the upper platform 31, and a stamp board 34 is secured to the bottom surface of the electric magnet 33. Alignment protrusions 35 are formed on the bottom surface of the stamp board 34. The thermal stamp 30 can be positioned with respect to the transfer target substrate 12 placed on a lower platform 36 by aligning the alignment protrusions 35 with alignment marks 37 on the transfer target substrate 12. Also, a thermal head 38 is formed to correspond to the region where the organic layer 17 is formed. The electric magnet 33 is off in the initial state.

The thermal head 38 is formed in stripes to correspond to the display region of the organic EL display 1. The thermal head 38 has a heat-generating resistive element and is heated in advance to a fixed temperature of 150° C. to 200° C.

A roll unit 39 is placed in the vacuum apparatus 29. A donor film 40 is loaded in the roll unit 39 in advance, and a new donor film 40 can be fed every time one transfer target substrate 12 is processed in a roll-to-roll manner. The donor film 40 has an organic donor layer 42 on one side of a base film 41. The donor film 40 is resistant to a temperature of 250° C. or higher, and loaded so that the organic donor layer 42 faces the transfer target substrate 12 as shown in FIG. 15. The donor film 40 is tightened without sagging with the roll unit 39. The roll unit 39 is placed above the transfer target substrate 12 so that the distance between the donor film 40 and the transfer target substrate 12 is 1 mm to 10 mm.

Note that, although FIG. 15 shows the mechanism for only the red (R) material, mechanisms similar to that shown in FIG. 15 for the green (G) and blue (B) materials are also installed side by side to form the green (G) and blue (B) portions sequentially. The transfer target substrate 12 is processed in line in the vertical direction as viewed from FIG. 15.

After the transfer target substrate 12 is moved to the transfer position, the lower platform 36 is moved to align the position of the transfer target of the transfer target substrate 12 with the thermal head 38 on the stamp board 34.

After completion of the alignment, the thermal stamp 30 is brought into close contact with the transfer target substrate 12 with the up/down movable mechanism 32. In FIG. 16, the thermal stamp 30 moves downward. Thereafter, the electric magnet 33 is turned on, to allow the thermal head 38 to come into close contact with the transfer target substrate 12 over the entire display region. With nickel (Ni) as the magnetic body 4 included in the transfer target substrate 12, the thermal stamp 30 and the transfer target substrate 12 come into close contact with each other by magnetic attraction. If the electric magnet 33 remains off, i.e., the electric magnet 33 is absent, transfer of the organic layer 17 according to a predetermined pattern will not be achieved due to warpage and distortion of the transfer target substrate 12.

Thereafter, after the electric magnet 33 is turned off, the thermal stamp 30 is moved away from the transfer target substrate 12 and the donor film 40 with the up/down movable mechanism 32. In FIG. 16, the thermal stamp 30 moves upward. Since the donor film 40 is under tension, it also moves away from the transfer target substrate 12 as the thermal head 38 moves.

The roll unit 39 then reels up a length of the donor film 40 equivalent to one transfer target substrate 12 for preparation of the next transfer target substrate 12.

Thereafter, the transfer target substrate 12 moves to be subjected to a series of operation for the green (G) and blue (B) materials.

Then, as the electron transport/injection layer 17C, Alq3 (an aluminum-quinolinol complex (aluminato-tris-8-hydroxyquinolate)) is deposited in a region at least including the display region of the organic EL display 1 to a thickness of 40 nm, as shown in FIG. 14, by a known vacuum evaporation method.

Thereafter, as the upper electrode (translucent cathode) 18, magnesium and silver (Mg.Ag) are deposited to a thickness of 1 nm to 20 nm continuously by a known evaporation method. This deposition is made solidly over a region at least including the display region.

Next, the sealing film 19 is formed in a region at least including the display region as shown in FIG. 7. In the illustrated example, silicon oxide ($SiO_2$) is deposited to a thickness of 500 nm by a known RF sputtering method. In FIG. 7, sealing portions on the periphery of the display region are also shown for the purpose of illustration.

Thereafter, using the sealing plate 23 made of alkali-free glass with the drying member 22 attached thereto and the sealing member 21 made of an epoxy resin, etc., the space between the sealing plate 23 and the sealing film 19 on the transfer target substrate 12 is filled with the sealing gas 20 made of nitrogen gas.

The sealing plate 23 has a function of preventing penetration of oxygen and water into the organic layer 17. The sealing plate 23 can also be formed of a quartz substrate. The sealing plate 23 is bonded to the transfer target substrate 12 with the sealing member 21 in a nitrogen gas atmosphere that is low in oxygen concentration and low in humidity. The sealing member 21 is made of an epoxy resin, but any other material low in oxygen permeability and moisture permeability can be used as the sealing member 21. Molten glass may also be used as the sealing member 21.

In the first embodiment, the organic EL element 24 has the bottom emission structure where light emission from the organic layer 17 is taken out from the side of the organic EL element 24 opposite to the side of formation of the organic layer 17, i.e., downwardly as is viewed from FIG. 7. Therefore, the drying member made of calcium oxide is bonded to the surface of the sealing plate facing the organic EL element 24.

It is possible to adopt a top emission structure where light emission is taken out from the side of formation of the organic layer, i.e., upwardly as is viewed from FIG. 7, without changing the purport of the present disclosure. In this case, the drying member 22 is not formed, and the sealing member 21 must be light-transmissive. Also, the upper electrode 18 must be as thin as about 5 nm and light-transmissive. As the drying material 22, barium oxide may also be used.

Thus, the organic EL display 1 is completed.

As described above, in the first embodiment, the donor film 40 is loaded between the transfer target substrate 12 and the plate-shaped thermal head 38, and the transfer target substrate 12 and the thermal head 38 are brought into close contact with each other by the magnetic attraction of the magnetic body 4. By this contact, the organic donor layer 42 is thermally transferred to the tops of the lower electrodes 7 of the transfer target substrate 12, forming portions of the organic layer 17. Thereafter, the upper electrode 18 is formed on the organic layer 17, to obtain the organic EL element 24. Therefore, even when the transfer target substrate 12 is large in size, the organic donor layer 42 can be transferred to the transfer target substrate 12 with high precision, to manufacture the organic EL element 24 with excellent quality free from display unevenness. Also, since it is unnecessary to press the thermal head 38 against the transfer target substrate 12 excessively in an attempt to eliminate transfer unevenness, the transfer target substrate 12 can be prevented from damage.

Second Embodiment

Figure 17:
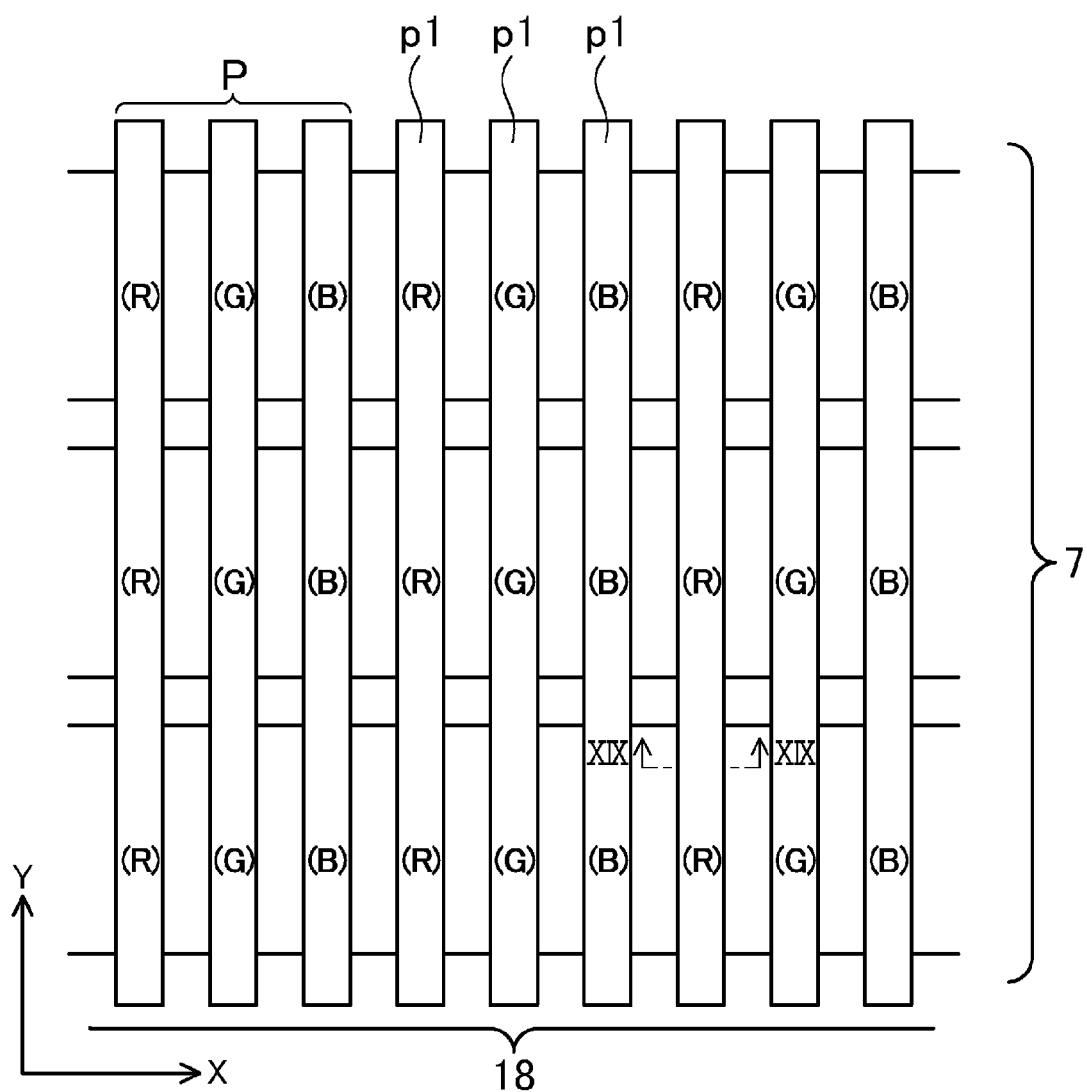
FIG. 17 is a plan view illustrating a pixel array having a number of pixels arranged in stripes in an organic EL display in the second embodiment.
Figure 18:
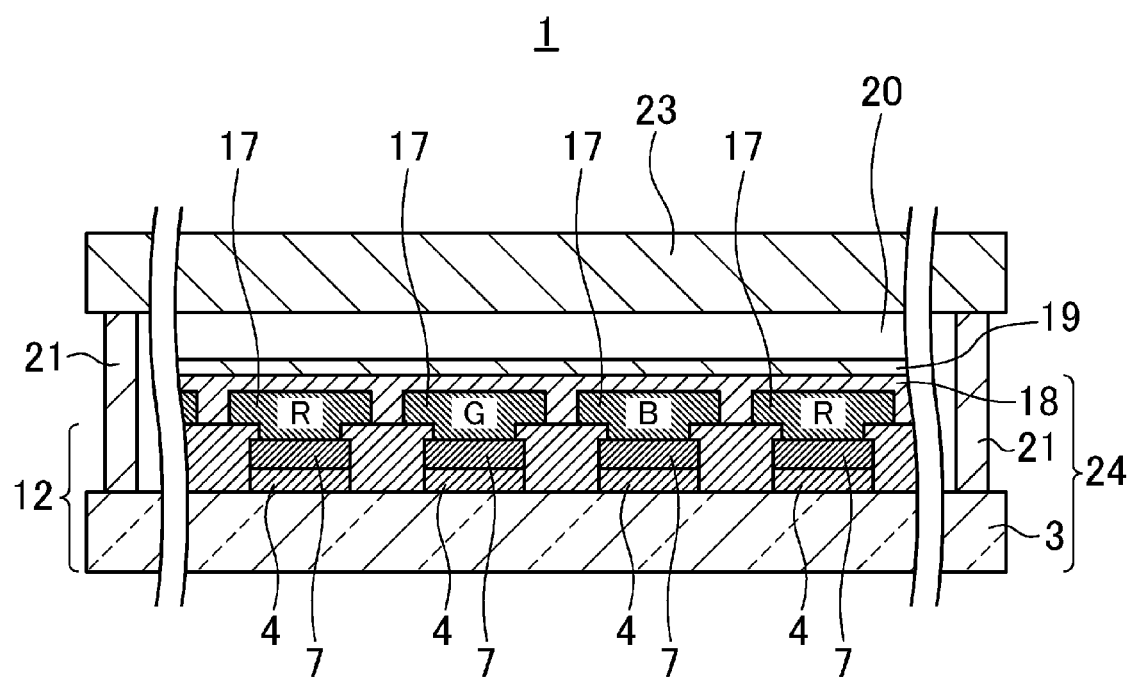
FIG. 18 is a cross-sectional view of the passive organic EL display in the second embodiment.
Figure 19:
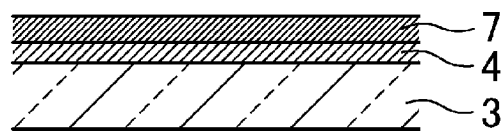
FIGS. 19A-19F are views showing step by step a procedure of forming a magnetic body and a lower electrode in the film formation process in the second embodiment, which are cross-sectional views of a portion along line XIX-XIX in FIG. 17.
Figure 19:
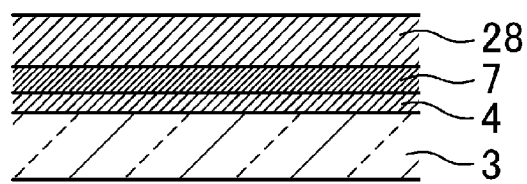
Figure 19:
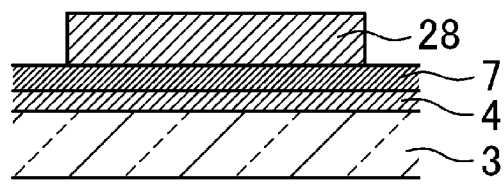
Figure 19:
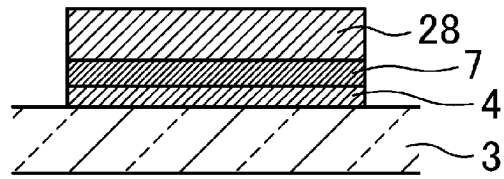
Figure 19:
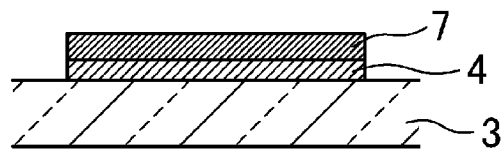
Figure 19:
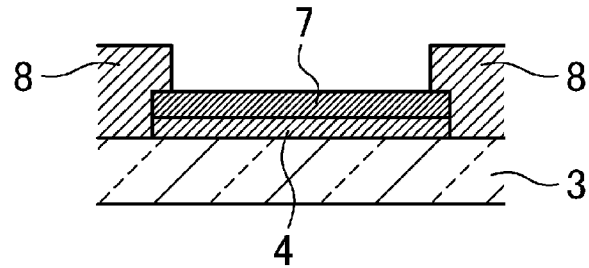

FIGS. 17-19 show the second embodiment 2. FIG. 17 is a plan view showing a pixel array having a number of pixels P (sub-pixels p1) arranged in stripes in a passive organic EL display 1 in the second embodiment 2. FIG. 18 is a cross-sectional view of the passive organic EL display 1 in the second embodiment 2. FIGS. 19A-19F are views showing step by step a procedure of forming a magnetic body 4 and a lower electrode 7 in the film formation process in the second embodiment, which are cross-sectional views of a portion along line XIX-XIX in FIG. 17.

In the second embodiment, no TFTs are formed. In other words, the organic EL display in the second embodiment is of a passive type having no switching elements such as TFTs in the pixels. As shown in FIG. 17, lower electrodes 7 formed in stripes and upper electrodes 18 formed in stripes are arranged in a matrix, where one sub-pixel p1 as a unit of light transmission is formed at an intersection between one lower electrode 7 and one upper electrode 8. A set of each one red (R), green (G), and blue (B) sub-pixels p1 as a unit is defined as one pixel P. In an organic EL display having a resolution of the video graphics array (VGA), 640 pixels in the X direction and 480 pixels in the Y direction are arranged in a matrix. An organic EL element 24 has an organic layer 17 between the upper electrodes 18 and the lower electrodes 7.

In the organic EL display 1 in the second embodiment, the upper electrodes are arranged in stripes, in contrast to the solid upper electrode in the first embodiment. As shown in FIG. 17, the magnetic body is formed in the same pattern as the lower electrodes. In the second embodiment, nickel (Ni) is used as the magnetic body, and aluminum (Al) is used as the lower electrodes. Since Ni is conductive, combinations of the magnetic body stripes and the lower electrodes can be regarded as electrodes in the second embodiment.

In the second embodiment, the top emission structure is adopted where light emission from the organic layer 17 is taken out from the side of the transfer target substrate 12 on which the organic layer 17 is formed (upwardly as is viewed from FIG. 18). Therefore, Al having high light reflectivity is used for the lower electrodes 7, and a 5-nm thin metal film is used for the upper electrodes 18, to render the upper electrodes 18 light-transmissive. Also, adopting the top emission structure, no drying member is used. As for the other part of the configuration, the same components as those in the first embodiment are denoted by the same reference characters, and description of such components is omitted.

A film formation process in the second embodiment will be described hereinafter with reference to FIGS. 19A-19F.

In FIG. 19A, first, an alkali-free glass substrate 3 is prepared. Foreign matters such as organic substances are removed from the glass substrate 3 in advance by IPA ultrasonic cleaning, pure-water cleaning, etc. Thereafter, nickel (Ni) is deposited to a thickness of 100 nm as the magnetic body 4 by direct current (DC) sputtering using a Ni target (purity: 5 N) under the film formation conditions of an ultimate vacuum of $1.0 \times 10^{-3}$ Pa, an Ar gas pressure of 0.6 Pa, and an input power of 80 mW/cm$^2$.

Subsequently, Al is deposited to a thickness of 100 nm using an Al target (purity: 5 N) as the material of the lower electrodes 7 under the film formation conditions of an ultimate vacuum of $1.0 \times 10^{-3}$ Pa, an Ar gas pressure of 0.6 Pa, and an input power of 80 mW/cm$^2$. As a result, a film of the material of the magnetic body 4 and a film of the material of the lower electrodes 7 are formed on the glass substrate 3 as shown in FIG. 19A.

Thereafter, as shown in FIG. 19B, a general photoresist 28 is formed by spin coating. Subsequently, after exposure of a predetermined pattern of the photoresist 28 to light using a photomask by stepper exposure equipment, exposed portions of the photoresist 28 are removed with an alkali developer, and then the resultant glass substrate 3 is washed with water, to obtain a structure as shown in FIG. 19C.

Subsequently, the glass substrate 3 of FIG. 19C is etched with a diluted nitric acid containing at least phosphoric acid, nitric acid, and water at room temperature for five minutes, and then washed with water, to obtain a structure as shown in FIG. 19D. In this way, the magnetic body 4 and the lower electrode 7 are etched in the same process.

Then, the photoresist 28 is removed with a remover solution, to obtain a structure as shown in FIG. 19E.

Although Ni is used as the magnetic body 4 in the second embodiment, iron (Fe) and cobalt (Co) can also be used. An alloy containing at least chromium (Cr) and an alloy containing at least manganese (Mn) can also be used. It is also possible to use an alloy containing at least nickel (Ni), an alloy containing at least iron (Fe), and an alloy containing at least cobalt (Co).

Thereafter, as shown in FIG. 19F, an edge cover 8 is formed to cover edge portions of the lower electrodes 7, thereby completing the process of manufacturing the transfer target substrate 12 before formation of the organic layer 17. Specifically, a photosensitive polyimide resin is applied to the glass substrate 3 of FIG. 19E by spin coating, exposed to light using a predetermined photomask, developed with an alkali developer, and then subjected to heat treatment, thereby forming a pattern of the edge cover 8 having openings corresponding to the portions that are to be the pixels P (sub-pixels p1), and thus completing the process of manufacturing the transfer target substrate 12.

Thereafter, the organic layer 17 is formed by thermal stamping in a manner similar to that described in the first embodiment.

Thus, in the second embodiment, advantages similar to those in the first embodiment can be obtained. In addition, in the second embodiment, since the magnetic body 4 is patterned to be present between the transfer target substrate 12 and the lower electrodes 7, the pattern of the magnetic body 4 can be formed simultaneously with the lower electrodes 7, and this is advantageous in the cost standpoint.

Third Embodiment

Figure 20:
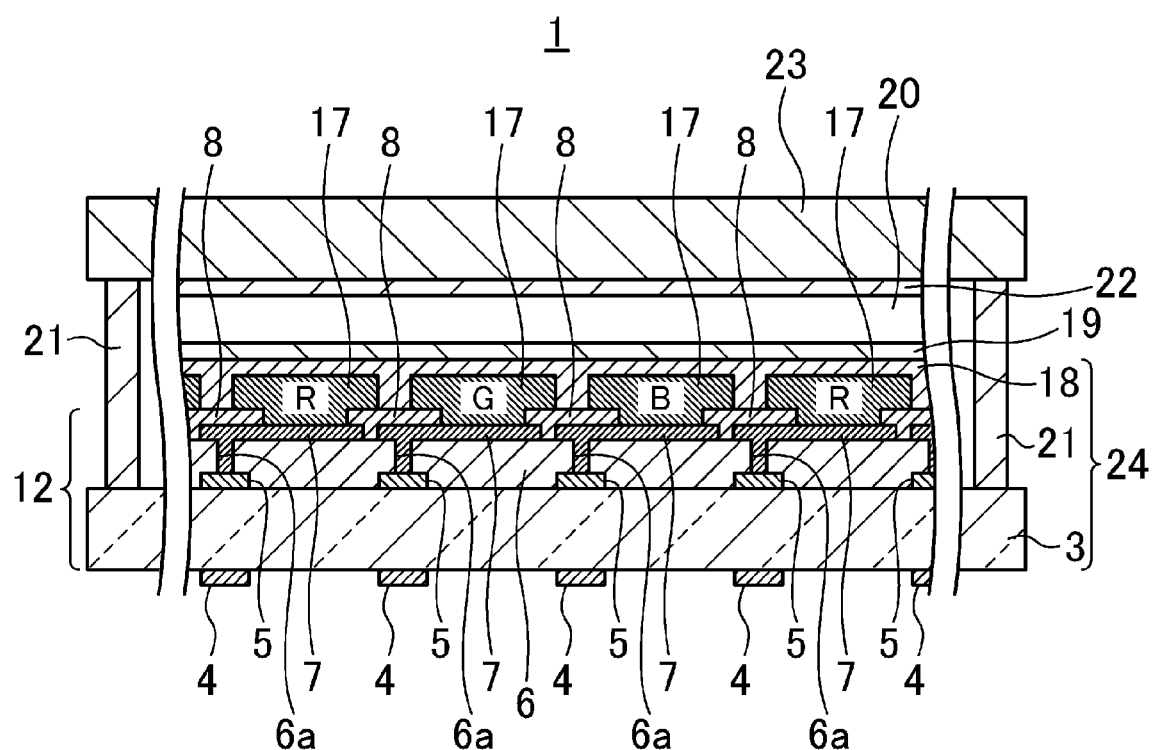
FIG. 20 is a cross-sectional view of an active organic EL display in the third embodiment.
Figure 21:
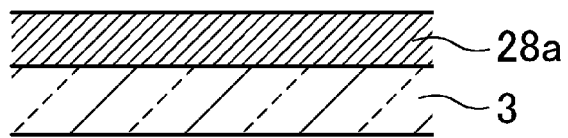
FIGS. 21A-21F are views showing step by step a procedure of forming a magnetic body in the film formation process in the third embodiment.
Figure 21:
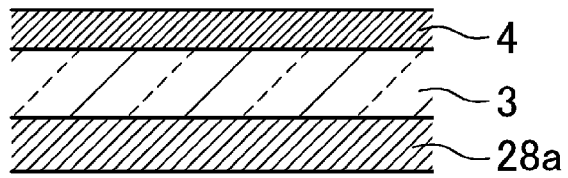
Figure 21:
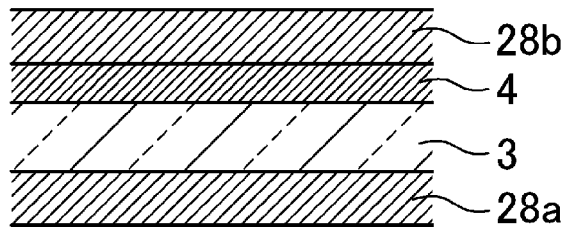
Figure 21:
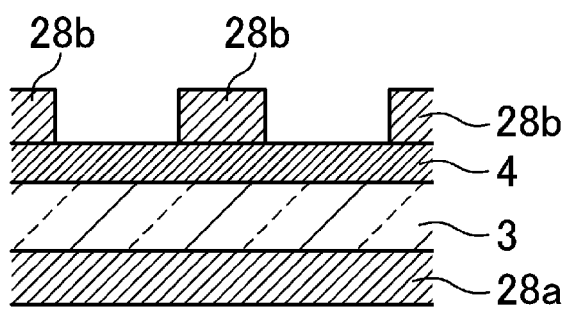
Figure 21:
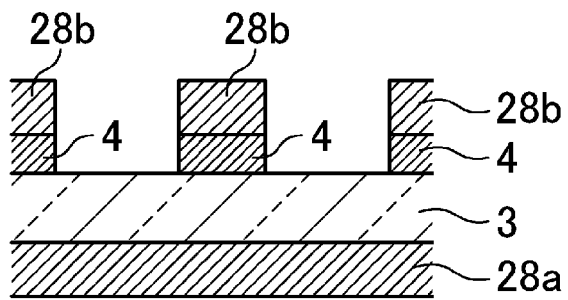
Figure 21:
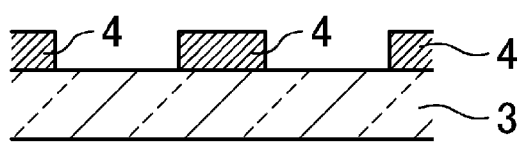

FIGS. 20 and 21 show the third embodiment. FIG. 20 is a cross-sectional view of an active organic EL display 1 in the third embodiment. FIGS. 21A-21F are views showing step by step a procedure of forming a magnetic body 4 in the film formation process in the third embodiment.

In the third embodiment, as shown in FIG. 20, the magnetic body 4 is formed on the side of a transfer target substrate 12 opposite to the side of formation of an organic layer 17. Also, the magnetic body 4 is patterned to have openings corresponding to the portions that are to be pixels P (sub-pixels p1). Although not shown, the magnetic body 4 may be covered with a protection film made of $SiO_2$ and a resin. In the third embodiment, such a protection film is not formed. Light emission from the organic layer 17 is taken out downwardly as is viewed from FIG. 7, i.e., from the side of the transfer target substrate 12 opposite to the side of formation of the organic layer 17.

Since a magnetic-permeable alkali-free glass substrate 3 is used in the transfer target substrate 12, a predetermined pattern of the organic layer 17 can be formed by thermal stamping by the action between the magnetic body 4 in FIG. 20 and the electric magnet 33 in FIG. 15.

Although the magnetic body 4 is patterned in the third embodiment, it may be formed solidly, for a top-emission organic EL element 24 as in the second embodiment, in a region at least including the display region on the surface of the transfer target substrate 12 opposite to the side of formation of the organic layer 17.

In the third embodiment, since the organic EL element 24 is of the bottom emission type, light emission from the organic layer 17 is taken out from the side of the transfer target substrate 12 opposite to the side of formation of the organic layer 17. Also, the magnetic body 4 is patterned to correspond to portions between the pixel portions.

A process of forming a pattern of the magnetic body 4 in the third embodiment will be described hereinafter.

In FIG. 21A, first, the alkali-free glass substrate 3 is prepared. Foreign matters such as organic substances are removed from the glass substrate 3 in advance by IPA ultrasonic cleaning, pure-water cleaning, etc. Thereafter, a photoresist 28a is applied to the surface of the glass substrate 3 on the side of formation of the organic layer 17 by spin coating. With this coating, the surface of the glass substrate 3 on the side of formation of the organic layer 17 is protected from scratching and adherence of smudges and dust. The resultant glass substrate 3 is heated on a hot plate of 110° C. to 160° C. in the atmosphere for five minutes, and then cooled on a cool plate.

Thereafter, as shown in FIG. 21B, nickel (Ni) is deposited on the surface of the glass substrate 3 opposite to the photoresist 28a to a thickness of 100 nm as the magnetic body 4 by DC sputtering using a Ni target (purity: 5 N) under the film formation conditions of an ultimate vacuum of $1.0 \times 10^{-3}$ Pa, an Ar gas pressure of 0.6 Pa, and an input power of 80 mW/cm$^2$.

Subsequently, as shown in FIG. 21C, a general photoresist 28b is applied to the magnetic body 4 by spin coating.

Thereafter, after exposure of a predetermined pattern of the photoresist 28b to light using a photomask by stepper exposure equipment, exposed portions of the photoresist 28b are removed with an alkali developer, and then the resultant glass substrate 3 is washed with water, to form a structure as shown in FIG. 21D. The pattern of the photoresist 28b has openings corresponding to regions that are to be the pixels P (sub-pixels p1).

During the above exposure, no pattern is formed on the photoresist 28a on the lower side as is viewed from FIG. 21D because Ni of the magnetic body 4 shades the light.

Thereafter, the magnetic body 4 on the glass substrate 3 in FIG. 21D is etched with a diluted nitric acid of phosphoric acid, nitric acid, and water at room temperature for three minutes, and then washed with water, to obtain a structure as shown in FIG. 21E.

Then, the photoresists 28a and 28b are removed with a remover solution, to obtain a structure as shown in FIG. 21F.

In FIG. 21F, the photoresist 28a on the bottom surface of the glass substrate 3 and the photoresist 28b on the magnetic body 4 are removed simultaneously with a remover solution.

Thereafter, the glass substrate 3 is turned upside down, and, although not shown, as in the steps in and after FIG. 11A, silicon oxynitride (SiON) is deposited on the entire surface of the glass substrate 3 opposite to the surface on which the magnetic body 4 is formed, to a thickness of 300 nm as the protection film 9 by a known CVD method. The protection film 9 is formed for prevention of diffusion of impurities from the glass substrate 3. Note that, in the steps in and after FIG. 11A, since the magnetic body 4 is already formed, the process is executed excluding the process of forming the magnetic body 4. Alignment marks may also be formed in the process shown in FIGS. 21A-21F, and the pattern formation in and after FIG. 11A may be performed using the alignment marks, whereby the pattern of the magnetic body 4 having openings aligned with the pixel portions can be formed.

Although Ni is used as the magnetic body 4 in the third embodiment, iron (Fe) and cobalt (Co) can also be used. An alloy containing at least chromium (Cr) and an alloy containing at least manganese (Mn) can also be used. It is also possible to use an alloy containing at least nickel (Ni), an alloy containing at least iron (Fe), and an alloy containing at least cobalt (Co).

The organic EL display 1 (organic EL element 24) as shown in FIG. 20 can be manufactured by executing the TFT formation process, the organic layer formation process including the thermal stamping process, the electrode formation process, the sealing process, etc. in the process in and after FIG. 11A. In the thermal stamping, it is possible to form a predetermined pattern of the organic layer because the thermal head 38 and the transfer target substrate 12 are brought into close contact with each other via the donor film 40 by the action between the magnetic body 4 formed by the process shown in FIGS. 21A-21F and the electric magnet 33 of the thermal stamp.

Therefore, in the third embodiment, also, advantages similar to those in the first embodiment can be obtained. In addition, in the third embodiment, since the magnetic body 4 is formed on the surface of the transfer target substrate 12 opposite to the side of formation of the organic layer 17, the magnetic body 4 is not affected by the film formation process executed on the side of formation of the organic layer. This makes it easy to adopt the conventional film formation process, and thus is advantageous from the cost standpoint.

INDUSTRIAL APPLICABILITY

The present disclosure is useful for an organic EL element suitable for a large-size organic EL display and a method for manufacturing the same.

DESCRIPTION OF REFERENCE CHARACTERS

4 Magnetic Body
7 Lower Electrode (First Electrode)
12 Transfer Target Substrate
17 Organic Layer
18 Upper Electrode (Second Electrode)
24 Organic EL Element
38 Thermal Head
40 Donor Film
42 Organic Donor Layer

The invention claimed is:

1. A method for manufacturing an organic EL element, comprising the steps of:
   preparing a donor film including an organic donor layer and a transfer target substrate including a first electrode; and
   thermally transferring the organic donor layer to the top of the first electrode of the transfer target substrate to form an organic layer by placing the donor film between the transfer target substrate and a thermal head and bringing the transfer target substrate and the thermal head into close contact with each other by magnetic attraction of a magnetic body, and then forming a second electrode on the organic layer, to obtain an organic EL element.

2. The method for manufacturing an organic EL element of claim 1, wherein
   the thermal head is switched between a state having magnetic attraction and a state having no magnetic attraction, and is attracted into contact with the magnetic body in the state having magnetic attraction.

3. The method for manufacturing an organic EL element of claim 1, wherein
the magnetic body is formed on a surface of the transfer target substrate on the side of formation of the organic layer.

4. The method for manufacturing an organic EL element of claim 1, wherein
the magnetic body is formed on a surface of the transfer target substrate opposite to the side of formation of the organic layer.

5. The method for manufacturing an organic EL element of claim 1, wherein
the magnetic body is patterned.

6. The method for manufacturing an organic EL element of claim 5, wherein
the magnetic body is patterned to be present between the transfer target substrate and the first electrode.

7. The method for manufacturing an organic EL element of claim 5, wherein
the magnetic body also serves as an interconnect pattern of the organic EL element.

8. The method for manufacturing an organic EL element of claim 1, wherein
the magnetic body includes at least one selected from iron, chromium, nickel, cobalt, and manganese.

9. An organic EL element manufactured by the method for manufacturing an organic EL element of claim 1.

\* \* \* \* \*